(12) United States Patent
Kim et al.

(10) Patent No.: US 11,266,041 B2
(45) Date of Patent: Mar. 1, 2022

(54) COOLING APPARATUS FOR ELECTRONIC ELEMENT

(71) Applicant: KMW INC., Hwaseong-si (KR)

(72) Inventors: Duk Yong Kim, Yongin-si (KR); Jun Woo Yang, Hwaseong-si (KR); Jin Soo Yeo, Hwaseong-si (KR); Chang Woo Yoo, Hwaseong-si (KR); Min Sik Park, Hwaseong-si (KR); Hye Yeon Kim, Gangjin-gun (KR)

(73) Assignee: KMW INC., Hwaseong-si (KR)

( * ) Notice: Subject to any disclaimer, the term of this patent is extended or adjusted under 35 U.S.C. 154(b) by 0 days.

(21) Appl. No.: 16/893,394

(22) Filed: Jun. 4, 2020

(65) Prior Publication Data

US 2020/0305308 A1   Sep. 24, 2020

Related U.S. Application Data

(63) Continuation of application No. PCT/KR2018/015619, filed on Dec. 10, 2018.

(30) Foreign Application Priority Data

Dec. 8, 2017  (KR) .................. 10-2017-0168698
Dec. 10, 2018 (KR) .................. 10-2018-0158227

(51) Int. Cl.
*H05K 7/20* (2006.01)
*H05K 5/03* (2006.01)

(52) U.S. Cl.
CPC .......... *H05K 7/20336* (2013.01); *H05K 5/03* (2013.01); *H05K 7/2039* (2013.01)

(58) Field of Classification Search
CPC . H01L 23/427; H01L 23/3672; H01L 23/367; F28D 15/0275; F28D 15/04;
(Continued)

(56) References Cited

U.S. PATENT DOCUMENTS 4,036,286 A * 7/1977 Anderson ........... F28D 15/0275
165/45
4,090,555 A * 5/1978 Anderson ............... F28D 15/04
165/76
(Continued)

FOREIGN PATENT DOCUMENTS

CN   2017-00117 U   1/2011
JP   H05-243441 A   9/1993
(Continued)

OTHER PUBLICATIONS

International Search Report for PCT/KR2018/015619 dated Mar. 21, 2019 and its English translation.
(Continued)

*Primary Examiner* — Adam B Dravininkas
(74) *Attorney, Agent, or Firm* — Insight Law Group, PLLC; Seung Lee (57) ABSTRACT

A printed circuit board includes one surface on which a plurality of electronic elements are mounted, at least one of the plurality of electronic elements generating heat during its operation, a board case which accommodates the printed circuit board, a cooling cover which has an inner surface and an outer surface, and a plurality of radial cooling bodies each formed to extend from the outer surface of the cooling cover so as to be inclined upward and configured to receive the heat generated from the printed circuit board to dissipate the heat externally. The inner surface of the cooling cover is in close contact with another surface of the printed circuit board while covering the board case. Each of the plurality of radial cooling bodies includes a unit heat pipe. The unit heat pipe includes one end which is connected to the outer surface of the cooling cover and another end to which a plurality of cooling ribs are formed to extend outward in a (Continued)

radial direction from an outer circumferential surface of the another end of the unit heat pipe.

13 Claims, 10 Drawing Sheets

(58) Field of Classification Search
CPC .... G06F 1/20; H05K 7/20336; H05K 7/2039; H05K 7/20154; H05K 7/20936; H05K 1/0203; H05K 7/20672; H05K 7/20409; H05K 5/03
See application file for complete search history.

(56) References Cited

U.S. PATENT DOCUMENTS

| | | | | |
|---|---|---|---|---|
| 5,396,947 A | * | 3/1995 | Itoh | H01L 23/427 165/104.14 |
| 5,925,929 A | * | 7/1999 | Kuwahara | F28D 15/0275 257/714 |
| 6,374,905 B1 | * | 4/2002 | Tantoush | H01L 23/367 165/104.33 |
| 6,807,059 B1 | | 10/2004 | Dale | |
| 7,028,757 B1 | * | 4/2006 | Hegde | F28D 15/0275 165/104.21 |
| 7,494,249 B2 | * | 2/2009 | Li | F21V 29/004 362/294 |
| 8,496,047 B2 | * | 7/2013 | Chang | H01L 23/427 165/80.2 |
| 2005/0263267 A1 | * | 12/2005 | Yu | H01L 23/427 165/104.26 |
| 2008/0007955 A1 | * | 1/2008 | Li | F21V 29/51 362/294 |
| 2013/0155616 A1 | * | 6/2013 | Tong | H05K 7/20909 361/696 |
| 2013/0229806 A1 | * | 9/2013 | Choi | F21V 29/717 362/294 |
| 2014/0290929 A1 | * | 10/2014 | Opila | H01L 23/345 165/287 |
| 2016/0102920 A1 | * | 4/2016 | Zaghlol | F28D 15/0266 165/104.21 |
| 2017/0194751 A1 | | 7/2017 | Little et al. | |
| 2017/0284738 A1 | * | 10/2017 | Watanabe | F28F 9/0131 |
| 2018/0172360 A1 | * | 6/2018 | Miura | F28D 15/0233 |

FOREIGN PATENT DOCUMENTS

| | | |
|---|---|---|
| JP | 07-283564 A | 10/1995 |
| JP | 11-054680 A | 2/1999 |
| JP | 2000-092819 A | 3/2000 |
| JP | 2000-161880 A | 6/2000 |
| JP | 2006-128388 A | 5/2006 |
| JP | 2009-283672 A | 12/2009 |
| JP | 2015-227768 A | 12/2015 |
| JP | 2017-055616 A | 3/2017 |
| KR | 10-2014-0126438 A | 10/2014 |

OTHER PUBLICATIONS

Office Action dated Jul. 6, 2021 from Japanese Patent Office for Japanese Application No. 2020-530655.

* cited by examiner

COOLING APPARATUS FOR ELECTRONIC ELEMENT

CROSS-REFERENCE TO RELATED APPLICATIONS

This application is a Continuation of International Application No. PCT/KR2018/015619, filed on Dec. 10, 2018, which claims the benefit of and priority to Korean Patent Application Nos. 10-2017-0168698, filed on Dec. 8, 2017, and 10-2018-0158227, filed on Dec. 10, 2018, the content of which are herein incorporated by reference in their entirety.

TECHNICAL FIELD

The present disclosure relates to a cooling apparatus for an electronic element, and more specifically, to a cooling apparatus for an electronic element which may achieve the lightweight entire product, and enable airflow in various directions, thereby improving cooling performance.

BACKGROUND ART

Generally, an electronic element generates heat at operation, and if the heat in a space in which the electronic element is integrated is accumulated without being dissipated to the outside, operation performance of the electronic element may be degraded.

The electronic element is mostly coupled by a soldering to a printed circuit board provided inside a board case, and forms a space enclosed by a cover and the board case for protection from the outside.

Figure 1:
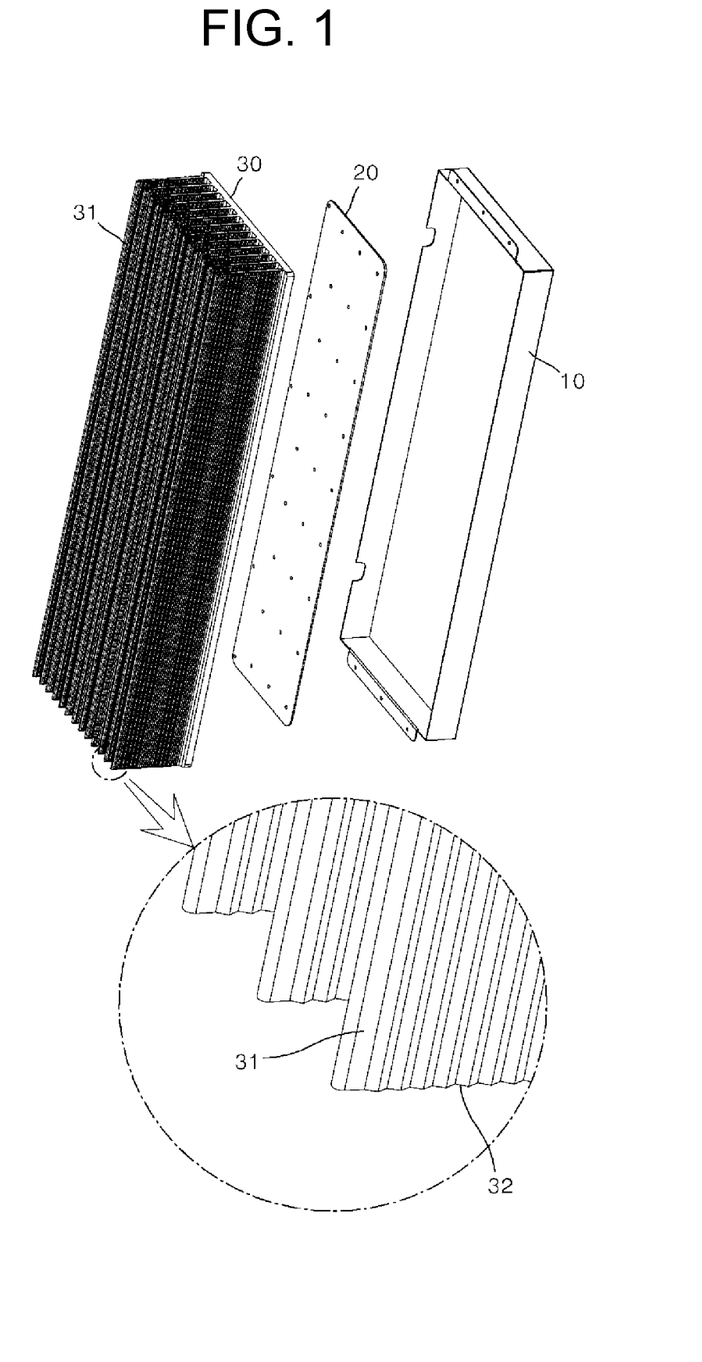
FIG. 1 is an exploded perspective diagram illustrating a general cooling apparatus for an electronic element according to the related art.

FIG. 1 is an exploded perspective diagram illustrating a general cooling apparatus for an electronic element according to the related art.

As illustrated in FIG. 1, a general cooling apparatus for an electronic element according to the related art includes a board case 10 which accommodates a printed circuit board 20 having the electronic element not illustrated mounted on one surface thereof, and a cover 30 which is coupled to the board case 10 while covering the printed circuit board 20 accommodated in the board case 10, and has a plurality of cooling ribs 31 formed integrally on the outer surface thereof.

Here, the inner surface of the cover 30 is disposed to be in surface contact with the other surface of the printed circuit board 20, such that heat generated from the electronic elements of the printed circuit board 20 is transferred to the inner surface of the cover 30, and then dissipated to the outside through the plurality of cooling ribs 31 formed integrally on the outer surface of the cover 30.

However, there is no problem in that the general cooling apparatus for the electronic element according to the related art configured as described above sufficiently dissipates heat only with the plurality of cooling ribs 31 formed integrally on the outer surface of the cover 30 if the number of electronic elements heat-generated at operation is small, but if a plurality of electronic elements are intensively installed in a limited space (that is, within the board case 10), there are problems in that sufficient heat dissipation is not implemented only with the conventional cooling rib 31, and heat is accumulated inside the board case 10, thereby degrading the operating performance of the electronic element.

In order to solve the above problems, the outer surface of the unit cooling rib 31 may be finely processed to have a groove 32 having a wave shape illustrated in FIG. 1 so as to increase the cooling areas of the plurality of cooling ribs 31, but an additional processing of the cooling area in the fixed portion as described above is an undesirable solution because of a limitation thereof.

Further, as illustrated in FIG. 1, the plurality of cooling ribs 31 are lengthily formed vertically so that outside air is introduced only in a vertical direction, and are formed to be spaced apart from each other at a predetermined distance in the left and right direction, such that there is a limitation in improving cooling performance because air flowability is degraded.

DISCLOSURE

Technical Problem

The present disclosure is intended to solve the above problems, and an object of the present disclosure is to provide a cooling apparatus for an electronic element, which may decrease the weight of a cover caused by providing a plurality of cooling ribs, thereby achieving the lightweight entire product.

Further, another object of the present disclosure is to provide a cooling apparatus for an electronic element, which may be designed so that air may flow into a plurality of radial cooling bodies from various directions, thereby improving cooling performance.

Technical Solution

An exemplary embodiment of a cooling apparatus for an electronic element according to the present disclosure includes: a printed circuit board which has a plurality of electronic elements mounted on one surface, at least one of the plurality of electronic elements generating heat at operation; a board case which accommodates the printed circuit board; a cooling cover which has the inner surface in close contact with the other surface of the printed circuit board while covering the board case; and a plurality of radial cooling bodies which have at least one provided to protrude from the outer surface of the cooling cover, are each formed to extend therefrom to be inclined upward, and receive heat generated from the printed circuit board to dissipate the heat outward.

Here, the plurality of radial cooling bodies may include: a plurality of unit heat pipes which have one ends coupled to the outer surface of the cooling cover so that a portion of the outer circumferential surface is recessed, and the other ends bent with respect to the one ends to extend outward to be inclined upward; and a plurality of cooling ribs which radially extend outward in a radius direction from some or all of the outer circumferential surfaces of the other ends of the plurality of unit heat pipes.

Further, the outer surface of the cooling cover may be formed with a plurality of heat conduction grooves to correspond to the number of plurality of unit heat pipes, the heat conduction groove being coupled with one ends of the plurality of unit heat pipes so that the one ends are recessed.

Further, the plurality of heat conduction grooves may lengthily form a line vertically, and may be formed so that the heat conduction grooves adjacent to each other vertically are spaced apart from each other at a predetermined distance.

Further, the plurality of heat conduction grooves may lengthily form a plurality of lines vertically, and may be formed so that the lines adjacent to each other horizontally are spaced apart from each other at a predetermined distance.

Further, the plurality of heat conduction grooves and the plurality of unit heat pipes may be disposed to have different heights of the heat conduction grooves and the unit heat pipes adjacent to each other horizontally.

Further, the plurality of cooling ribs formed on the outer circumferential surfaces of the other ends of the plurality of unit heat pipes may be each formed so that the tip spaced apart from the outer circumferential surface of the other end of the unit heat pipe is not formed upward at least.

Further, the plurality of radial cooling bodies may further include a pipe fixing block which is coupled to the outer surface of the cooling cover, and fixes the plurality of unit heat pipes to surround the outer circumferential surfaces of the one ends of the plurality of unit heat pipes which are not recessed to the outer surface of the cooling cover.

Further, the one ends of the plurality of unit heat pipes and the pipe fixing block among the components of the plurality of radial cooling bodies may be provided at locations which correspond to locations of the plurality of electronic elements disposed on the inner surface of the cooling cover.

Further, the plurality of cooling ribs among the components of the plurality of radial cooling bodies may be formed to be spaced apart from the outer surface of the cooling cover at a predetermined distance.

Further, each of the tips of the plurality of cooling ribs among the components of the plurality of radial cooling bodies may be formed to have the same separation distance with respect to the outer surface of the cooling cover.

Further, the plurality of unit heat pipes may be provided so that heat transfer fluid is filled therein, the heat transfer fluid being vaporized by heat transferred from the cooling cover and transferring the heat to the plurality of cooling ribs and then being liquefied.

Further, the plurality of unit heat pipes may have one ends coupled to the outer surface of the cooling cover and the one ends are located lower than the other ends provided with the plurality of cooling ribs.

Advantageous Effects

The exemplary embodiment of the cooling apparatus for the electronic element according to the present disclosure may achieve various effects as follows.

First, by being replaced with the plurality of radial cooling bodies which form the same cooling area as compared to the plurality of conventional cooling ribs, it is possible to achieve the lightweight entire product.

Second, the outside air may flow into the plurality of radial cooling bodies in various paths and various directions, thereby improving cooling performance.

Third, the plurality of radial cooling bodies are disposed to be inclined upward to the outside, thereby minimizing the influence of the cooling air from the bottom on the radial cooling body at the upper side to entirely enable the uniform cooling.

| <Detailed Description of Main Elements> | | | |
| --- | --- | --- | --- |
| 100: | cooling apparatus | 105: | board case |
| 110: | cooling cover | 111: | heat conduction groove |
| 120: | printed circuit board | 125: | electronic element |
| 130, 130': | radial cooling body | 140: | unit heat pipe |
| 141: | one end | 142: | the other end |
| 150: | cooling rib | 160: | pipe fixing block |

BEST MODE

Hereinafter, some exemplary embodiments of the present disclosure will be described in detail through exemplary drawings. It should be noted that in adding reference numerals to the components of each drawing, the same components have the same reference numerals as possible even though they are displayed on different drawings. Further, in describing the present disclosure, when it is determined that detailed descriptions of related well-known structures or functions may obscure the gist of the present disclosure, the detailed descriptions thereof will be omitted.

Throughout the specification, when a part "includes" or "has" a component, it means that the part may further include other components, rather than excluding other components, unless otherwise specified. Since the term "electronic element" used in the specification means "a heat-generating element" in which heat is generated at operation thereof, they may be interchangeably used as the same concept.

Figure 2:
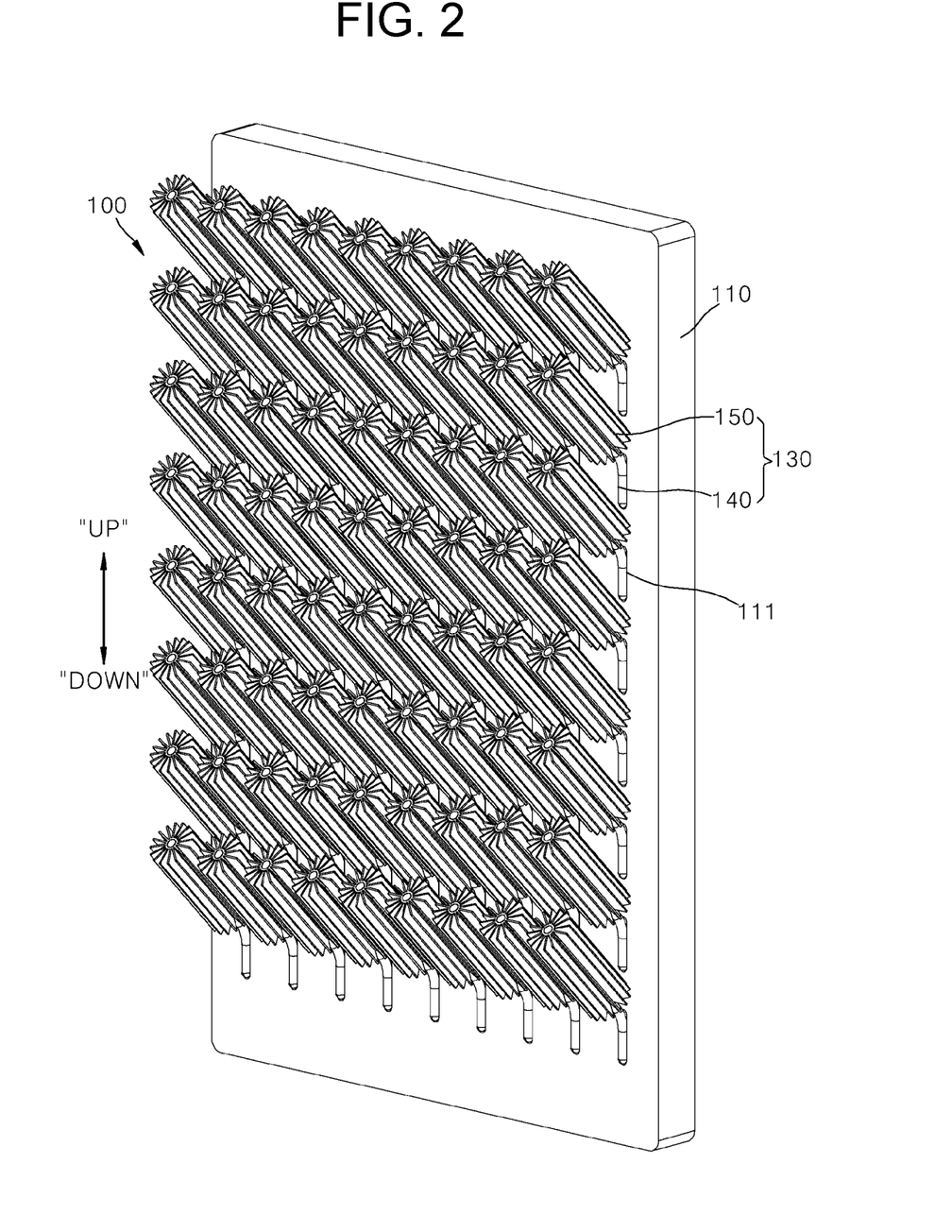
FIG. 2 is a perspective diagram illustrating an exemplary embodiment of a cooling apparatus for an electronic element according to the present disclosure.
Figure 3:
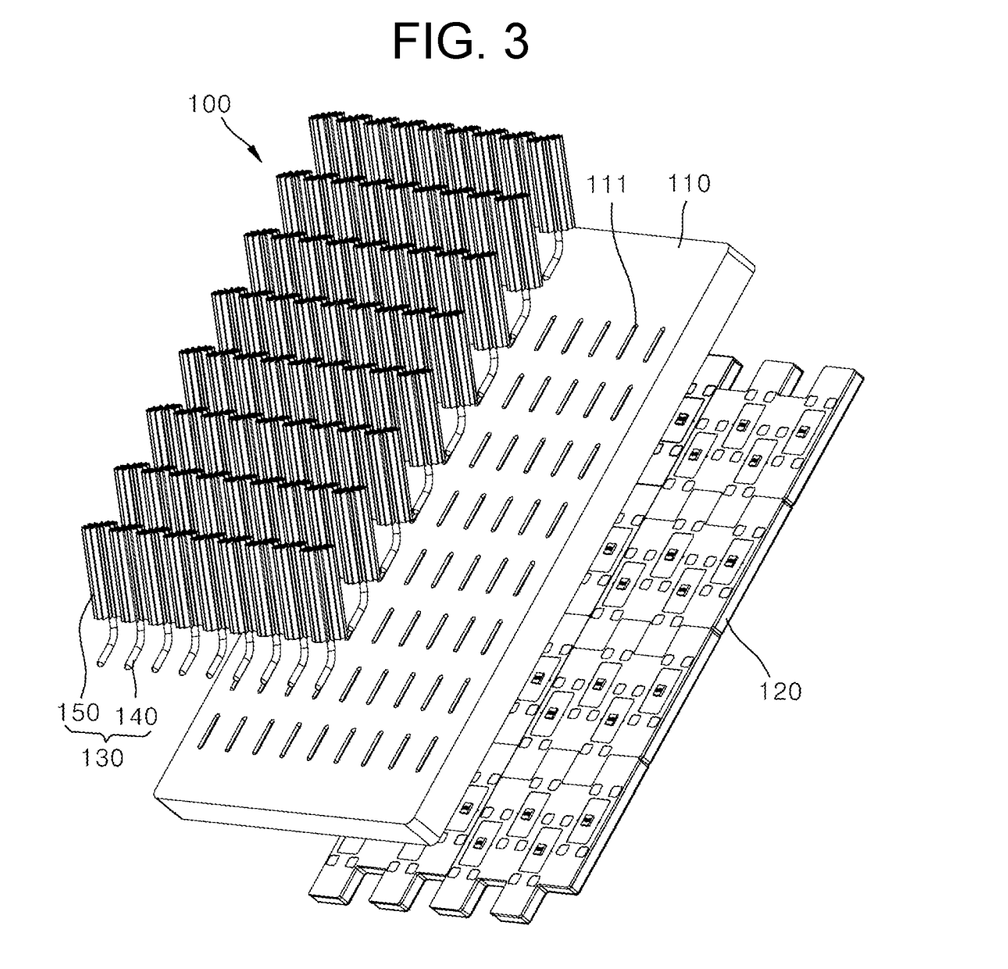
FIG. 3 is an exploded perspective diagram of FIG. 2.
Figure 4:
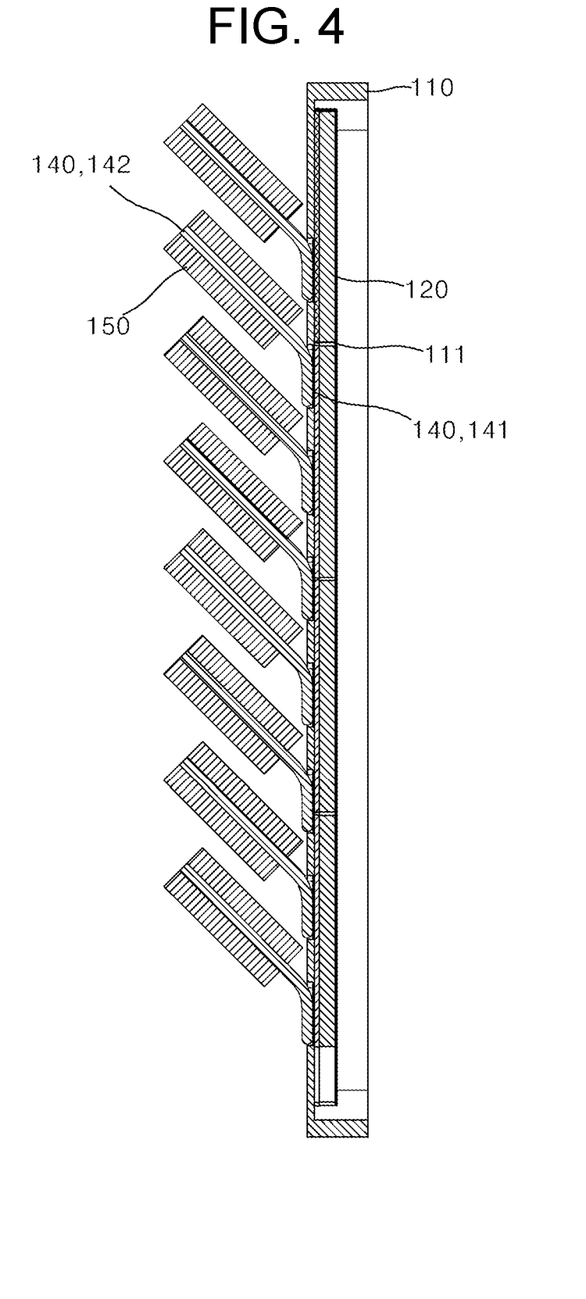
FIG. 4 is a cross-sectional diagram taken along the line A-A illustrated in FIG. 2.
Figure 5:
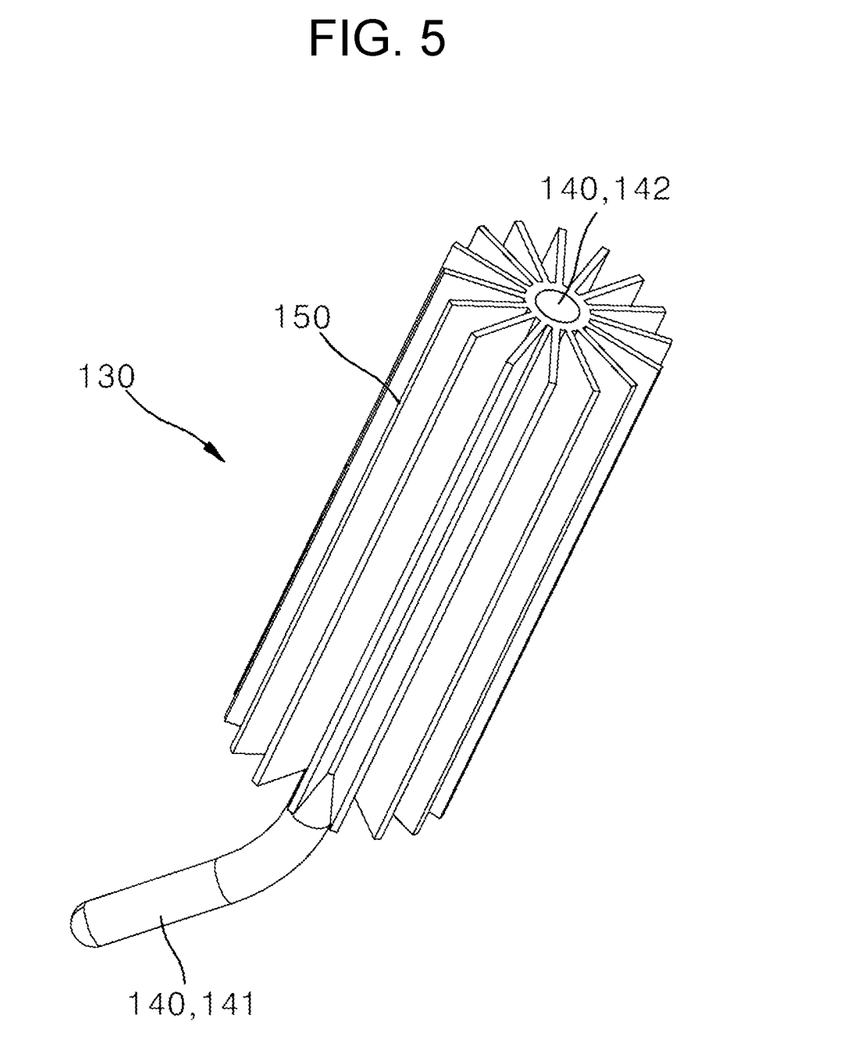
FIG. 5 is a perspective diagram illustrating a unit radial cooling body among the components illustrated in FIG. 2.
Figure 6:
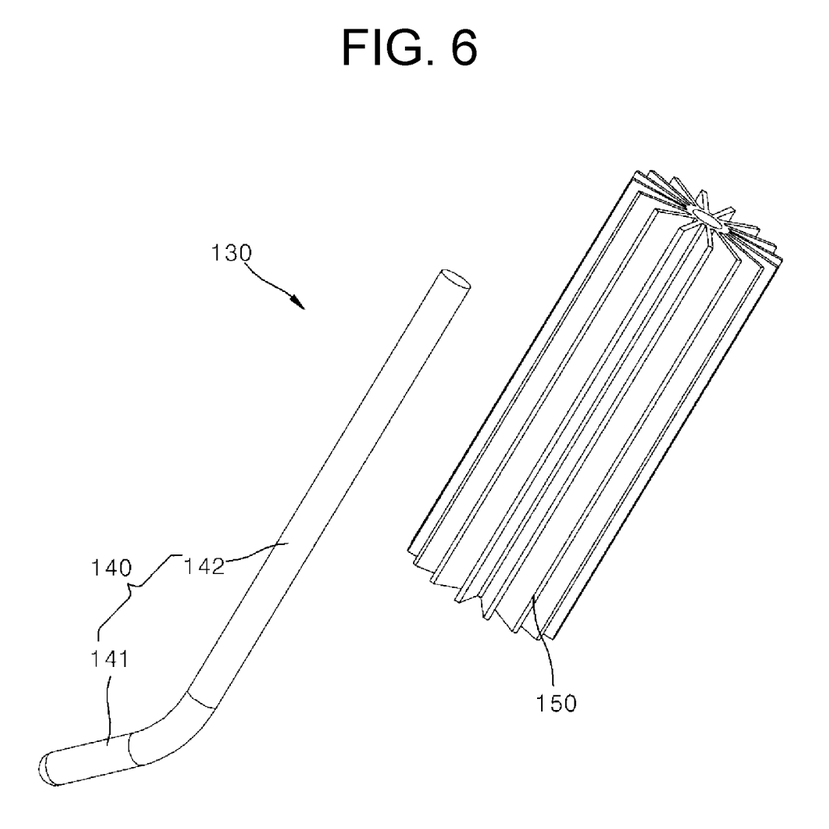
FIG. 6 is an exploded perspective diagram of FIG. 5.

FIG. 2 is a perspective diagram illustrating an exemplary embodiment of a cooling apparatus for an electronic element according to the present disclosure, FIG. 3 is an exploded perspective diagram of FIG. 2, FIG. 4 is a cross-sectional diagram taken along the line A-A illustrated in FIG. 2, FIG. 5 is a perspective diagram illustrating a unit radial cooling body among the components illustrated in FIG. 2, and FIG. 6 is an exploded perspective diagram of FIG. 5.

As illustrated in FIGS. 2 to 6, an exemplary embodiment of a cooling apparatus for an electronic element 100 according to the present disclosure includes a printed circuit board 120 which has a plurality of electronic elements 125, of which at least one generates heat at operation, mounted on one surface thereof.

Here, the printed circuit board 120 is described as being limited to being provided so that the plurality of electronic elements 125 are mounted on only one surface, but it is natural that the double-sided type in which the electronic elements 125 are mounted on both surfaces may also fall within the scope of the claims of the present disclosure.

Meanwhile, the plurality of electronic elements 125 are a concept including all the heat-generating elements which generate predetermined heat while operating electrically, and may be representatively a power supply unit (PSU), a field programmable gate array (FPGA) element, and the like which are installed in an antenna apparatus, and additionally, may also include an element configuration whose performance may be degraded due to heat generation.

Meanwhile, an exemplary embodiment of the present disclosure may further include a board case 105 which accommodates the aforementioned printed circuit board 120 (see FIGS. 7 and 8) and a cooling cover 110 which has the inner surface in close contact with the other surface of the printed circuit board 120 while covering the board case 105. Here, the cooling cover 110 is also a component which corresponds to a housing of the antenna apparatus, and may be a concept including all the components as long as they may protect the antenna elements, the PSU, and the FPGA elements which are mounted on the printed circuit board 120 from the outside and may dissipate heat to the outside regardless of the name thereof.

The cooling cover 110 is preferably made of a conductive material to serve to transfer the heat generated from the plurality of electronic elements 125 mounted on the printed circuit board 120 to the outside even while protecting the printed circuit board 120 accommodated inside the board case 105 from the outside. Although not illustrated in the drawing, the plurality of radial cooling bodies 130 to be described later may further include a plurality of cooling fins formed integrally with the outer surface separately at the outside of the cooling cover 110.

Further, an exemplary embodiment of the cooling apparatus for the electronic element 100 according to the present disclosure may further include a plurality of radial cooling bodies 130 in which at least one radial cooling body 130 is provided to protrude from the outer surface of the cooling cover 110 and formed to extend to be inclined upward, respectively, and which receive heat generated from the printed circuit board 120 to dissipate the heat to the outside.

As described above, if the plurality of cooling fins are formed integrally on the outer surface of the cooling cover 110, the plurality of radial cooling bodies 130 may be disposed to directly contact a portion of the cooling cover 110 in a state where the plurality of cooling fins are removed.

The plurality of radial cooling bodies 130 may include a plurality of unit heat pipes 140 which are coupled to the outer surface of the cooling cover 110 and a plurality of cooling ribs 150 which are formed on each of the plurality of unit heat pipes 140.

As illustrated in FIG. 5, if the unit heat pipe 140 is provided to have a circular cross section, the plurality of cooling ribs 150 may be formed to radially extend outward from the circumferential surface around the longitudinal direction of the unit heat pipe 140, respectively.

The plurality of cooling ribs 150 are a component which corresponds to the cooling ribs 30 formed integrally on the outer surface of the conventional cooling cover 10 illustrated in FIG. 1, and may be produced within a smaller space when being formed to have the same area as the area of the conventional cooling rib 30, thereby improving an effective cooling area.

Further, since each of the plurality of cooling ribs 150 is formed radially around each of the unit heat pipes 140 in terms of the formation direction, a flow path of the outside air for cooling may be variously formed, thereby preventing a phenomenon in which the flow air stagnates between the plurality of radial cooling bodies 130 to maximize cooling performance.

It should be noted that the cooling apparatus for the electronic element according to an exemplary embodiment of the present disclosure proposes a new structure called the plurality of radial cooling bodies 130 to overcome the limitations of the fine processing of the groove with respect to the unit cooling rib, which is the conventional problem, but is not a concept of completely excluding the processing of the groove shape for each of the plurality of cooling ribs 150. At this time, the shape processing of the groove for each of the plurality of cooling ribs 150 is preferably performed so that the groove is formed in the size or shape of a limit in which the flow of air flowing between the plurality of radial cooling bodies 130 does not stagnate as described above.

Meanwhile, the plurality of unit heat pipes 140 may be filled therein with the heat transfer fluid, which is vaporized by the heat transferred from the cooling cover 110 and then, liquefied when the heat is dissipated to the outside by the plurality of cooling ribs 150.

Here, the heat transfer fluid is a medium which performs heat transfer in a method for repeatedly performing a process in which the heat transfer fluid is vaporized by the heat transferred from the cooling cover 110 at one end 141 of the unit heat pipe 140 and moves to the top which is the other end 142 of the unit heat pipe 140 to transfer the heat to the outside from the cooling cover 110, and then is liquefied near the other end 142 of the unit heat pipe 140.

Accordingly, in the plurality of unit heat pipes 140, the side provided in a heat source (the one end 141 of the unit heat pipe 140 in an exemplary embodiment of the present disclosure) is required to be provided at a location lower than the side where heat is dissipated (the other end 142 of the unit heat pipe 140 in an exemplary embodiment of the present disclosure. That is, the heat transfer fluid uses a principle in which the heat transfer fluid moves upward in the case of high temperature by a fluid movement principle.

Accordingly, in the plurality of unit heat pipes 140, one end coupled to the outer surface of the cooling cover 110 is required to be located lower than the other end provided with the plurality of cooling ribs 150.

Hereinafter, an exemplary embodiment of the present disclosure is limitedly described as adopting a structure in which the heat transfer is performed after the heat transfer fluid filled inside the plurality of unit heat pipes 140 moves upward by the fluid movement principle upon vaporization and then the heat transfer fluid is moved back to the heat source provided at the bottom by gravity upon liquefaction.

Meanwhile, the outer surface of the cooling cover 110 may be formed with a plurality of heat conduction grooves 111 so as to correspond to the number of plurality of unit heat pipes 140 and the one ends 141 of the plurality of unit heat pipes 140 are coupled to the plurality of heat conduction grooves 111 so that the one ends are recessed. Here, it has been already described that if the plurality of cooling fins are formed integrally on the outer surface of the cooling cover 110 as described above, some of the plurality of the cooling fins may be removed or deleted so as not to interfere with the plurality of unit heat pipes 140.

The heat conduction grooves 111 lengthily form a line vertically, and the heat conduction grooves 111 adjacent to each other vertically are preferably formed to be spaced apart from each other at a predetermined distance. Further, the plurality of heat conduction grooves 111 may lengthily form a plurality of lines vertically and the lines adjacent to each other horizontally may be formed to be spaced apart from each other at a predetermined distance.

The one ends 141 of the plurality of unit heat pipes 140 described above may be coupled to have a one-to-one correspondence with each of the plurality of heat conduction grooves 111 thus disposed. Accordingly, since the outside air flows into the spaces which are spaced vertically and horizontally, various air flow paths for cooling may be designed.

Meanwhile, in an exemplary embodiment of the cooling apparatus for the electronic element 100 according to the present disclosure, the plurality of radial cooling bodies 130 may further include a pipe fixing block 160 which is coupled to the outer surface of the cooling cover 110, and fixes the plurality of unit heat pipes 140 to surround the outer circumferential surfaces of the one ends 141 of the plurality of unit heat pipes 140 which are not recessed to the outer surface of the cooling cover 110.

The pipe fixing block 160 is preferably made of a material with excellent heat conduction which collects heat of the electronic element 125 transferred to the outer surface of the cooling cover 110 to effectively transfer the heat to the one end 141 of the plurality of unit heat pipes 140.

One sides of the outer circumferential surfaces of the one ends 141 of the plurality of unit heat pipes 140 are accommodated in close contact with the heat conduction groove 111 formed on the outer surface of the cooling cover 110, and the other sides of the outer circumferential surfaces of the one ends 141 of the plurality of unit heat pipes 140 are disposed to be accommodated in close contact with the pipe fixing block 160, thereby transferring the heat generated from the electronic element 125 to the one ends 141 of the plurality of unit heat pipes 140 as much as possible.

Meanwhile, the one ends 141 of the plurality of unit heat pipes 140 and the pipe fixing block 160 among the components of the plurality of radial cooling bodies 130 are preferably provided at locations which correspond to each of the locations of the plurality of electronic elements 125 disposed on the inner surface of the cooling cover 110.

The plurality of unit heat pipes 140 do not directly receive the heat generated from each of the electronic elements 125 but are configured so that the heat generated from the electronic elements 125 is transferred via the pipe fixing block 160 through a minimum heat flow path in location.

Meanwhile, in the plurality of cooling ribs 150 among the components of the plurality of radial cooling bodies 130, the ends thereof located adjacently to the outer surface of the cooling cover 110 are preferably formed to be at least spaced apart from the outer surface of the cooling cover 110 at a predetermined distance. Further, when the plurality of cooling ribs 150 have a predetermined thickness from the outer surface of the cooling cover 110 by the pipe fixing block 160 provided at the outside of the cooling cover 110, the ends of the plurality of cooling ribs 150 located adjacently to the outer surface of the pipe fixing block 160 are preferably formed to be spaced apart from the outer surface of the pipe fixing block 160 at a predetermined distance.

This is to directly dissipate the heat transferred to the outer surface of the cooling cover 110 or the outer surface of the pipe fixing block 160 to the outside through the separate space.

A cooling process of an exemplary embodiment of the cooling apparatus for the electronic element 100 according to the present disclosure configured as described above will be briefly described with reference to the accompanying drawings (particularly, FIGS. 2 to 6).

First, the heat generated at operation of the electronic element 125 from one surface of the printed circuit board 120 on which the electronic element 125 is mounted is transferred to the other surface of the printed circuit board 120, and then transferred to the inner surface of the cooling cover 110 disposed in close contact with the other surface of the printed circuit board 120.

Further, the heat transferred to the inner surface of the cooling cover 110 is transferred to the outer surface of the cooling cover 110 and primarily dissipated through the separation space between the outer surface of the cooling cover 110 and the plurality of cooling ribs 150, and also, the residual heat is transferred to each of the one ends 141 of the plurality of unit heat pipes 140 through the heat conduction groove 111 formed in the outer surface of the cooling cover 110 and the pipe fixing block 160.

Then, the heat transfer fluid filled inside the plurality of unit heat pipes 140 is vaporized and moved to the other ends 142 of the plurality of unit heat pipes 140 which are located at relatively higher locations, and secondarily dissipates the heat through the plurality of cooling ribs 150 provided on the outer circumferential surface thereof.

At this time, the heat transfer fluid repeatedly undergoes the process in which the vaporized heat transfer fluid is condensed in the process of transferring the heat to the plurality of cooling ribs 150 to be liquefied again, and at the same time, the heat transfer fluid moves in a gravity direction and is vaporized by the heat transferred from the printed circuit board 120 again, thereby quickly dissipating the heat generated from the electronic element 125 to the outside.

Meanwhile, if the heat is dissipated from the plurality of radial cooling bodies 130 located at the lower side, as described above, an exemplary embodiment of the cooling apparatus for the electronic element 100 according to the present disclosure may prevent the degradation of the cooling performance of the plurality of radial cooling bodies 130 provided at the relatively upper side by the primarily or secondarily dissipated heat of the plurality of radial cooling bodies 130 provided at the lower side because the upward airflow is induced outward by the plurality of radial cooling bodies 130 provided at the upper side even if the heat-dissipated air forms the upward airflow by forming all of the plurality of radial cooling bodies 130 to protrude to be inclined upward with respect to the cooling cover 110.

Further, in an exemplary embodiment of the cooling apparatus for the electronic element 100 according to the present disclosure, the plurality of radial cooling bodies 130 adjacent to each other are disposed to be spaced apart from each other at a predetermined distance, respectively, such that the amount of air introduced may largely increase as compared to the conventional one as the outside air flows to the cooling rib 150 while forming various flow paths, thereby improving cooling performance.

Figure 7:
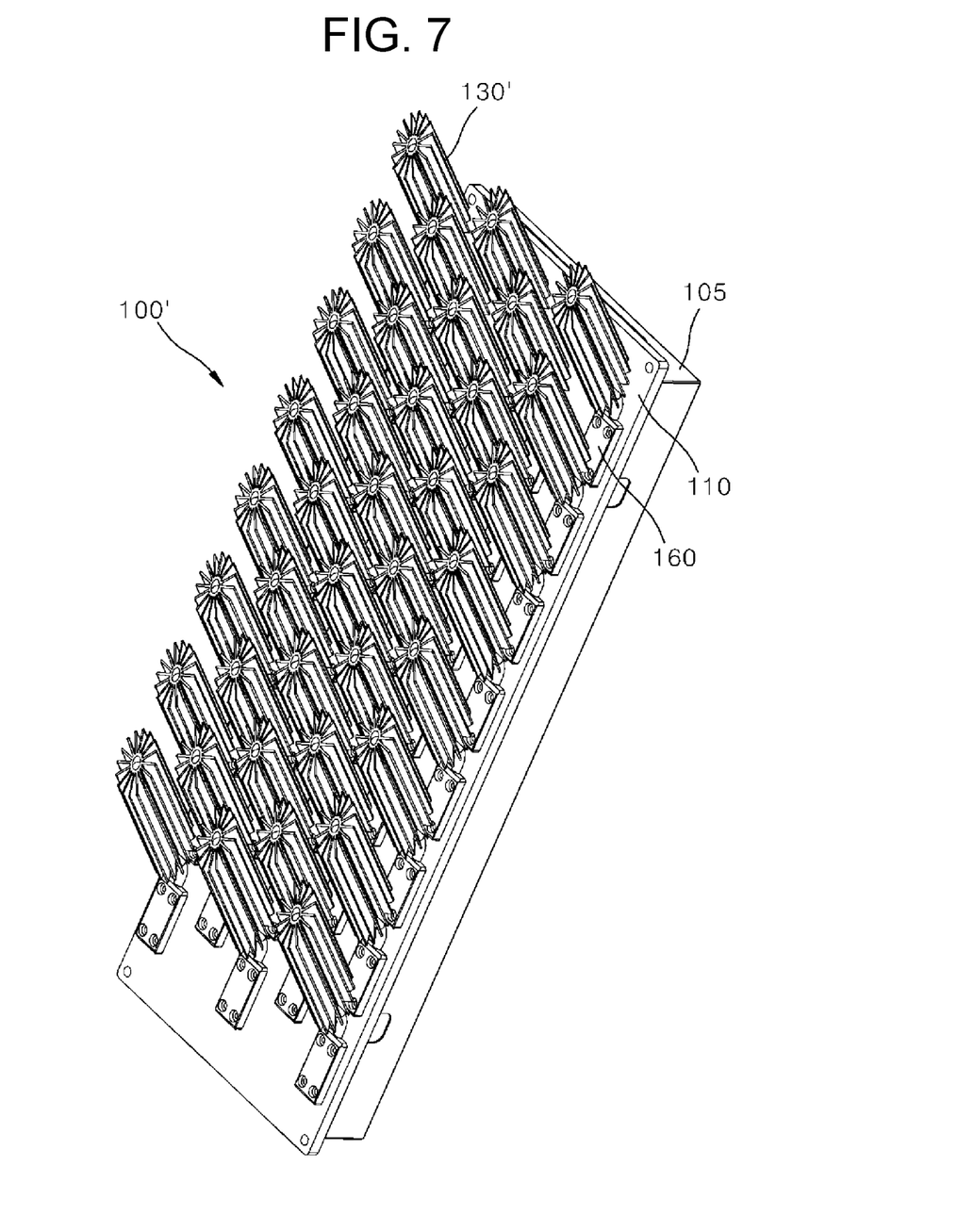
FIG. 7 is a perspective diagram illustrating another exemplary embodiment of a cooling apparatus for an electronic element according to the present disclosure.
Figure 8:
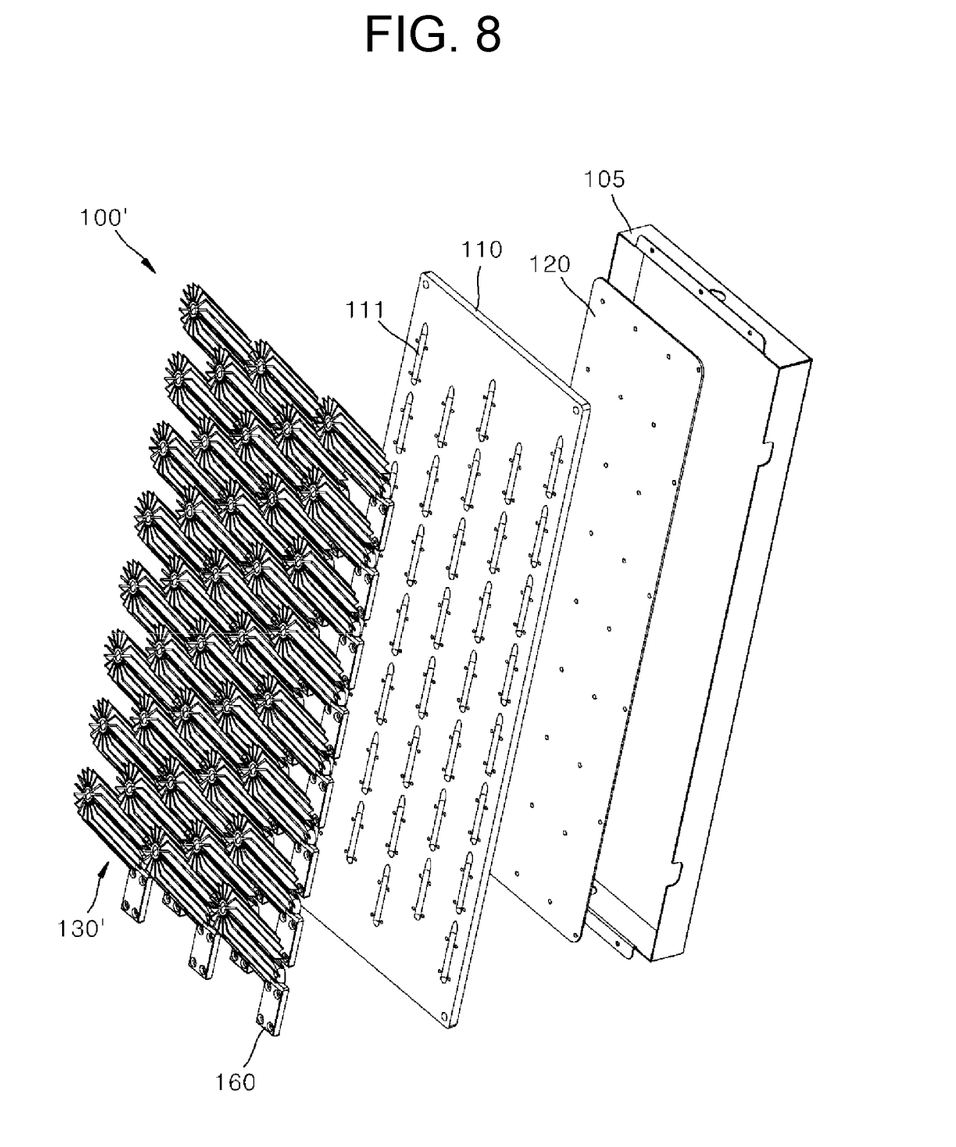
FIG. 8 is an exploded perspective diagram of FIG. 7.
Figure 9:
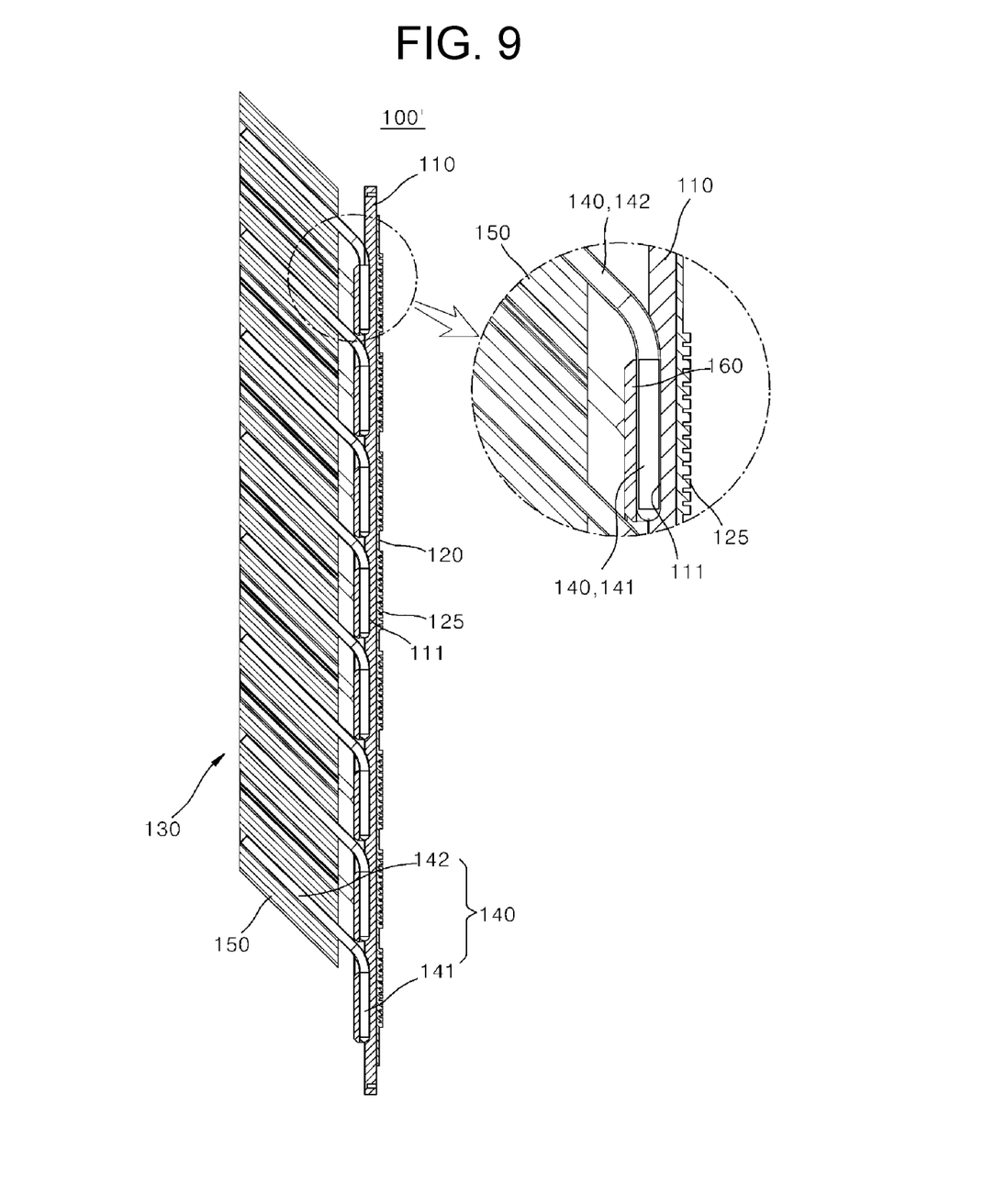
FIG. 9 is a cross-sectional diagram taken along the line B-B illustrated in FIG. 7.

FIG. 7 is a perspective diagram illustrating another exemplary embodiment of a cooling apparatus for an electronic element according to the present disclosure, FIG. 8 is an exploded perspective diagram of FIG. 7, and FIG. 9 is a cross-sectional diagram taken along the line B-B illustrated in FIG. 7.

It is assumed that another exemplary embodiment of a cooling apparatus for an electronic element 100' according to the present disclosure basically has the same technical feature as the aforementioned exemplary embodiment in which the plurality of radial cooling bodies 130 are disposed to be spaced apart from each other at a predetermined distance on the outer surface of the cooling cover 110.

Accordingly, another exemplary embodiment of the cooling apparatus for the electronic element 100' according to the present disclosure disclosed below will be mainly described with respect to the technical configuration different from that of the aforementioned exemplary embodiment.

As illustrated in FIGS. 7 to 9, another exemplary embodiment of the cooling apparatus for the electronic element 100' according to the present disclosure may be provided so that the plurality of heat conduction grooves 111 and the plurality of unit heat pipes 140 are disposed to have different heights of the heat conduction grooves 111 and the unit heat pipes 140 adjacent to each other horizontally.

That is, the plurality of radial cooling bodies 130 lengthily form the line vertically, and are disposed in a plurality of lines, and each of the radial cooling bodies 130 may be disposed differently in height from the adjacent cooling bodies, thereby securing more various flow paths of the outside air.

Further, in another exemplary embodiment of the present disclosure, each of the tips of the plurality of cooling ribs 150 among the components of the plurality of radial cooling bodies 130 may be formed to have the same separation distance with respect to the outer surface of the cooling cover 110. That is, each of the tips of the cooling ribs 150 of the plurality of radial cooling bodies 130 forms the tip surface parallel to the outer surface of the cooling cover 110, thereby easily designing the exposure to the outside.

Further, although not illustrated in the drawings, in the case of the exemplary embodiment and another exemplary embodiment of the present disclosure, since the plurality of cooling ribs 150 are installed to be exposed to the outside, there is a concern of adhesion of foreign substances or the like, such that a rib protective cover in which a plurality of flow holes through which the air of the plurality of cooling ribs 150 flows are formed may be provided separately. The rib protective cover is preferably manufactured in a suitable form capable of performing a function for preventing damage when installed by an operator so long as cooling performance is not degraded.

Figure 10:
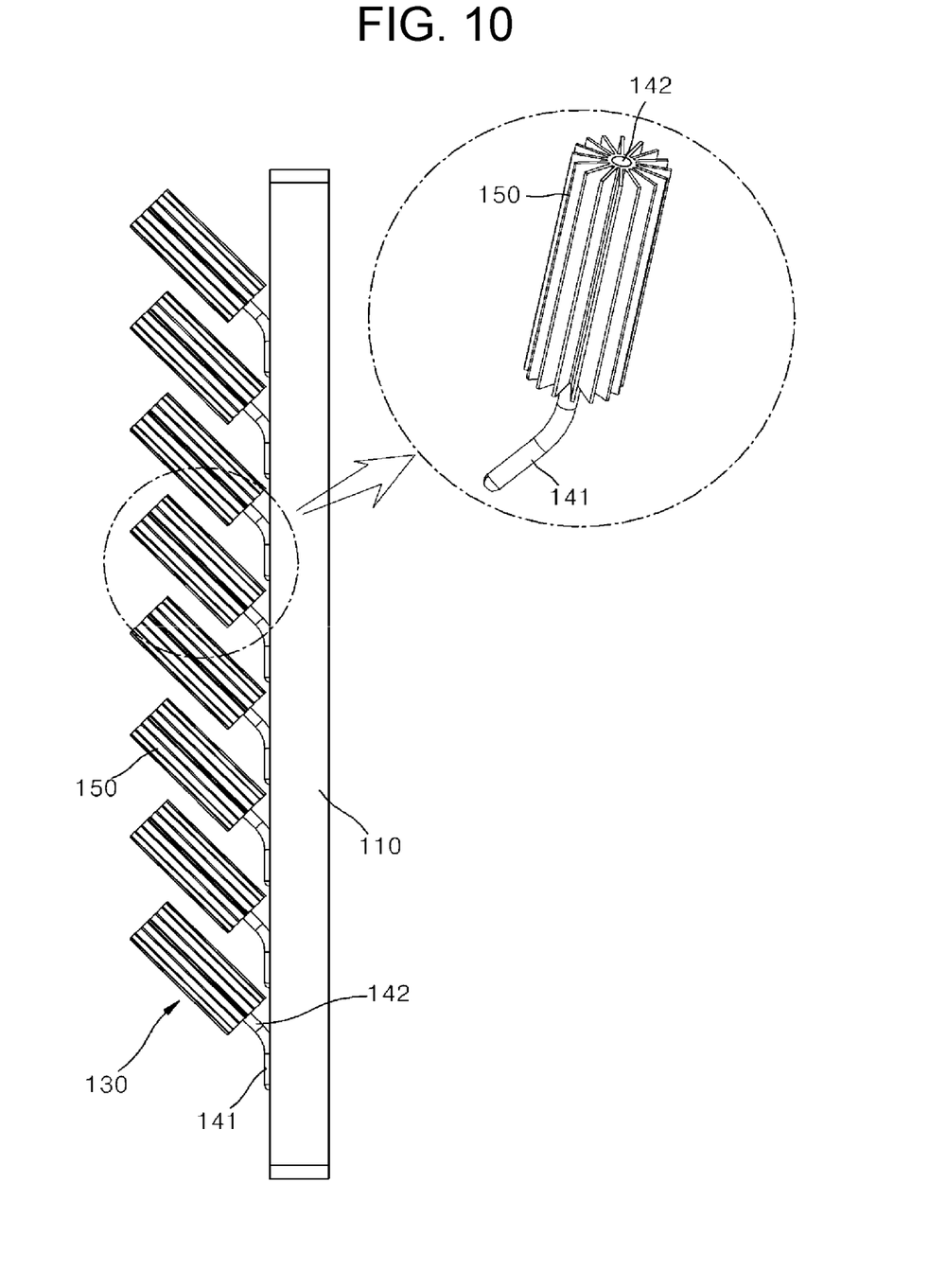
FIG. 10 is a cross-sectional diagram and a partially enlarged perspective diagram illustrating still another exemplary embodiment of a cooling apparatus for an electronic element according to the present disclosure.

FIG. 10 is a cross-sectional diagram and a partially enlarged perspective diagram illustrating still another exemplary embodiment of the cooling apparatus for the electronic element 100 according to the present disclosure.

As illustrated in FIG. 10, in still another exemplary embodiment of the cooling apparatus for the electronic element 100 according to the present disclosure, the plurality of cooling ribs 150 formed on the outer circumferential surfaces of the other ends 142 of the plurality of unit heat pipes 140, respectively may be formed so that the tip spaced apart from the outer circumferential surface of the other end 142 of the unit heat pipe 140 is not formed upward at least. Here, the outer circumferential surface of the other end 142 of the unit heat pipe 140 means a rod-shaped outer circumferential surface disposed to be inclined upward, and the tips of the plurality of cooling ribs 150 refer to the edges of the plurality of cooling ribs 150 which are the farthest from the outer circumferential surface of the other end 142 of the unit heat pipe 140.

That is, the meaning that the tips of the plurality of cooling ribs 150 are formed not to be upward from the outer circumferential surfaces of the plurality of unit heat pipes 140 is to provide the plurality of radial cooling bodies 130 in a shape which provides the plurality of cooling ribs 150 only on a half portion (downward portion) of the outer circumferential surfaces of the other ends 142 of the plurality of unit heat pipes 140 and does not provide the plurality of cooling ribs 150 on the other half portion (upward portion).

In this case, as illustrated in FIG. 10, since a larger number of radial cooling bodies 130 may be installed on the outer surface of the cooling cover 110 having the limited area to be close to each other or in close contact with each other, thereby further improving the cooling performance.

As described above, the exemplary embodiments of the cooling apparatus for the electronic element according to the present disclosure have been described in detail with reference to the accompanying drawings. However, it is natural that the exemplary embodiments of the present disclosure are not necessarily limited to the aforementioned exemplary embodiments, and various modifications and practice in an equivalent scope are possible by those skilled in the art to which the present disclosure pertains. Accordingly, the true scope of the present disclosure will be defined by the claims to be described later.

INDUSTRIAL APPLICABILITY

The exemplary embodiments of the cooling apparatus for the electronic element according to the present disclosure may be particularly used in the antenna apparatus having the electronic element with high heat generation.

The invention claimed is:

1. A cooling apparatus for an electronic element comprising:
   a printed circuit board comprising one surface on which a plurality of electronic elements are mounted, at least one of the plurality of electronic elements generating heat during its operation;
   a board case which accommodates the printed circuit board;
   a cooling cover which has an inner surface and an outer surface, wherein the inner surface of the cooling cover is in close contact with an another surface of the printed circuit board while covering the board case; and
   a plurality of radial cooling bodies each formed to extend from the outer surface of the cooling cover so as to be inclined upward and configured to receive the heat generated from the printed circuit board to dissipate the heat externally,
   wherein each of the plurality of radial cooling bodies comprises a unit heat pipe, wherein the unit heat pipe comprises one end which is connected to the outer surface of the cooling cover and another end to which a plurality of cooling ribs are formed to extend outward in a radial direction from an outer circumferential surface of the another end of the unit heat pipe.

2. The cooling apparatus for the electronic element of claim 1,
   wherein portions of the outer surface of the cooling cover are recessed.

3. The cooling apparatus for the electronic element of claim 2,
   wherein the outer surface of the cooling cover is formed with a plurality of heat conduction grooves corresponding to a number of the plurality of unit heat pipes, each of the plurality of heat conduction grooves being coupled with one end of a corresponding unit heat pipes of the plurality of unit heat pipes so that the one end is embedded in the respective heat conducting groove.

4. The cooling apparatus for the electronic element of claim 3,
   wherein a first number of heat conduction grooves among the plurality of heat conduction grooves longitudinally form a line vertically, and are formed so that the first number of heat conduction grooves adjacent to each other vertically are spaced apart from each other at a predetermined distance.

5. The cooling apparatus for the electronic element of claim 3,
   wherein a first number of heat conduction grooves among the plurality of heat conduction grooves longitudinally form a plurality of lines vertically, and are formed so that the lines adjacent to each other horizontally are spaced apart from each other at a predetermined distance.

6. The cooling apparatus for the electronic element of claim 3,
wherein the plurality of heat conduction grooves and the plurality of unit heat pipes are disposed to have different heights of the heat conduction grooves and the unit heat pipes adjacent to each other horizontally.

7. The cooling apparatus for the electronic element of claim 2,
wherein the plurality of cooling ribs formed on the outer circumferential surface of the another end of each of the plurality of unit heat pipes are each formed so that each tip of the plurality of cooling ribs spaced apart from the outer circumferential surface of the another end of the unit heat pipe is not higher than the another end of the unit heat pipe.

8. The cooling apparatus for the electronic element of claim 2,
wherein each of the plurality of radial cooling bodies further comprises a pipe fixing block which is coupled to the outer surface of the cooling cover, and fixes a corresponding unit heat pipe to surround the outer circumferential surface of the one end of the corresponding unit heat pipe which are not recessed to the outer surface of the cooling cover.

9. The cooling apparatus for the electronic element of claim 8,
wherein the one end of each of the plurality of unit heat pipes and the respective pipe fixing block among the components of the plurality of radial cooling bodies is provided at a location corresponding to a location of a respective one of the plurality of electronic elements disposed on the inner surface of the cooling cover.

10. The cooling apparatus for the electronic element of claim 2,
wherein the plurality of cooling ribs are formed to be spaced apart from the outer surface of the cooling cover at a predetermined distance.

11. The cooling apparatus for the electronic element of claim 2,
wherein a distance from each of the tips of the plurality of cooling ribs to the outer surface of the cooling cover is the same as a distance from all other tips to the outer surface of the cooling cover.

12. The cooling apparatus for the electronic element of claim 2,
wherein the plurality of unit heat pipes are provided so that heat transfer fluid is filled therein, the heat transfer fluid being configured to be vaporized by heat transferred from the cooling cover and to transfer the heat to the plurality of cooling ribs and then be liquefied.

13. The cooling apparatus for the electronic element of claim 12,
wherein each of the plurality of unit heat pipes has one end coupled to the outer surface of the cooling cover and the one end is located lower than the another end provided with the plurality of cooling ribs.

\* \* \* \* \*